(12) United States Patent
Lee et al.

(10) Patent No.: US 6,875,706 B2
(45) Date of Patent: Apr. 5, 2005

(54) CLEANING SOLUTION AND METHOD OF CLEANING A SEMICONDUCTOR DEVICE USING THE SAME

(75) Inventors: Kwang-Wook Lee, Gyeonggi-do (KR);
Dae-Hyuk Chung, Gyeonggi-do (KR);
In-Seak Hwang, Gyeonggi-do (KR);
Yong-Sun Ko, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/671,245

(22) Filed: Sep. 24, 2003

(65) Prior Publication Data

US 2004/0115909 A1 Jun. 17, 2004

(30) Foreign Application Priority Data

Dec. 17, 2002 (KR) ................................ 10-2002-0080610

(51) Int. Cl.[7] .............................................. H01L 21/30
(52) U.S. Cl. ........................................................ 438/745
(58) Field of Search ................................ 438/689, 694, 438/696, 706, 745, 712, 725, 734; 134/1–1.3, 184

(56) References Cited

U.S. PATENT DOCUMENTS

| | | | | |
|---|---|---|---|---|
| 6,095,167 A | * | 8/2000 | Florez | 134/183 |
| 6,584,989 B2 | * | 7/2003 | Taft et al. | 134/100.1 |
| 6,630,074 B1 | * | 10/2003 | Rath et al. | 252/79.3 |
| 6,664,196 B1 | * | 12/2003 | Wada et al. | 438/754 |
| 2003/0209514 A1 | * | 11/2003 | Ramachandran et al. | 216/2 |

FOREIGN PATENT DOCUMENTS

| | | | | |
|---|---|---|---|---|
| EP | 0 918 081 A1 | * | 5/1999 | C09K/13/08 |
| JP | 10079366 | | 3/1998 | |
| JP | 11-243085 | * | 9/1999 | H01L/21/308 |
| KR | 2000-61342 | | 10/2000 | |

OTHER PUBLICATIONS

English language of Abstract for Japanese Patent Publication No. JP10079366, filed Mar. 24, 1998.
English language of Abstract for Korean Patent Publication No. 2000–61342, filed Oct. 16, 2000.

* cited by examiner

*Primary Examiner*—Evan Pert
(74) *Attorney, Agent, or Firm*—Marger Johnson & McCollom, P.C.

(57) ABSTRACT

In a cleaning solution and a method of cleaning a semiconductor substrate, the cleaning solution includes about 1 to about 10 percent by weight of sulfuric acid, about 0.5 to about 5 percent by weight of aqueous hydrogen peroxide solution, and about 85 to about 98.5 percent by weight of hydrogen fluoric acid solution. Various polymers attached to a metal wiring formed on a substrate are removed by immersing the substrate into the cleaning solution. The substrate is rinsed to remove the cleaning solution remaining on the substrate. Thus, the polymers can be completely removed without damage to the metal wiring and an underlying oxide film.

15 Claims, 9 Drawing Sheets

CLEANING SOLUTION AND METHOD OF CLEANING A SEMICONDUCTOR DEVICE USING THE SAME

BACKGROUND OF THE INVENTION

1. Field of the Invention

This disclosure relates to a cleaning solution and a method of cleaning a semiconductor device using the same, and more particularly to a cleaning solution for completely removing various polymers attached to a tungsten wiring of a semiconductor device and a method of cleaning a semiconductor device using the same.

2. Description of the Related Art

Recently, semiconductor devices have been greatly improved as information processing apparatus such as a computers are rapidly developed. The semiconductor device is required to have rapid response speed and large storage capacity so that a semiconductor manufacturing process is developed to improve integration density and reliability of the semiconductor device.

To accomplish high integration density of a semiconductor device, a cell of the semiconductor device should be reduced. In accordance with reduction of the size of the cell, all the patterns formed on a substrate have reduced dimensions and processing margins are also decreased. Hence, the semiconductor device may not have adequate electrical insulation and refresh characteristics. Also, sizes of the patterns are greatly reduced and multi-layered wirings are demanded according as the semiconductor device has high integration density.

As design rules for semiconductor devices are reduced, a metal having a relative low electrical resistance is used for metal wirings of the semiconductor device instead of a metal having high electrical resistance. For example, tungsten silicide, rather than tungsten, is employed for the metal wiring of the semiconductor device to be used as a gate electrode or a bit line of a volatile or non-volatile memory device.

As processes of forming a metal wiring and a contact hole for multi-layered metal wirings are more frequently employed in a semiconductor manufacturing process, a dry etch process for etching a metal and an ashing process for removing a photoresist pattern are also frequently performed. When the metal wiring is formed using the dry etch and ashing processes, impurities are generated from a dry etch gas, the photoresist pattern, an oxide film, and a tungsten film and the impurities are attached to a sidewall of the metal wiring. The impurities may increase electrical resistance of a semiconductor device or may cause an electrical short between adjacent metal wirings when the impurities remain on the metal wiring. Thus, these impurities should be removed from the metal wiring.

Japanese Patent Laid Open Publication No. 10-779366 discloses a method of removing impurities remaining on a substrate using a cleaning solution including about 24 percent by weight of sulfuric acid, about 5 percent by weight of aqueous hydrogen peroxide solution, about 0.02 percent by weight of hydrogen fluoride, about 0.075 percent by weight of N-dodecyl benzene sulfonic acid and water. The impurities on the substrate are removed by immersing the substrate into the cleaning solution for about 10 minutes and rinsing the substrate using deionized water for about 7 minutes.

Korean Patent Laid Open Publication No. 2000-61342 discloses a method of removing polymers remaining on a substrate by successively using a cleaning solution of sulfuric acid ($H_2SO_4$) and aqueous hydrogen peroxide solution ($H_2O_2$), a cleaning solution of hydrofluoric acid (HF) and water ($H_2O$), and an SC1 cleaning solution. The polymers are generated after a dry etch process for forming a tungsten suicide wiring on the substrate.

Meanwhile, an organic stripper including hydroxylamine is generally used in a cleaning process for removing impurities generated after a process of etching a tungsten wiring because the organic stripper may not cause damages of the tungsten wiring and an underlying film. However, the organic stripper may not completely remove the impurities remaining on a substrate. The organic stripper may not effectively remove oxygen-containing polymers (polymeric oxides) generated during etching of the tungsten wiring so that the impurities are not completely removed from the substrate. Additionally, because the impurities attached to the tungsten wiring are adequately removed from the tungsten wiring for more than about 20 minutes, the time required for removing the impurities may be too long when the impurities are removed using the organic stripper.

To solve the above-mentioned problems, an improved organic stripper has been developed. The improved organic stripper additionally includes fluorine-containing chemicals like HF or NHF4, an organic solvent, and a corrosion inhibitor. The organic solvent can prevent a metal wiring from being damaged due to the fluorine-containing chemicals. However, the improved organic stripper may not effectively remove polymers generated during etching the metal wiring and the improved organic stripper is very expensive. Also, the improved organic stripper may excessively etch some underlying films to such an extent that the improved organic stripper can hardly be employed for a semiconductor manufacturing process.

Embodiments of the invention address these and other disadvantages of the conventional art.

SUMMARY OF THE INVENTION

Among other advantages, embodiments of the invention the provide a cleaning solution that can effectively remove various polymers attached to tungston wiring without damage to the tungsten wiring and an underlying film. Additionally, the time required for removing the polymers can be greatly reduced, improving the throughput of the semiconductor device.

BRIEF DESCRIPTION OF THE DRAWINGS

The above and other advantages of the invention will become readily apparent by describing in detail exemplary embodiments thereof with reference to the accompanying drawings.

DETAILED DESCRIPTION OF THE INVENTION

Figure 1:
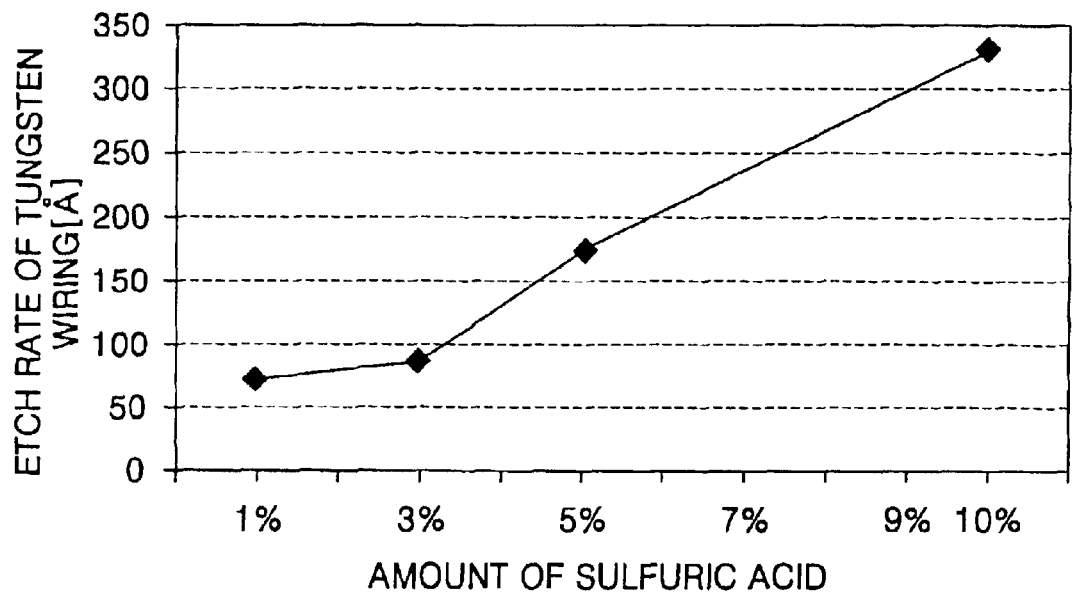
FIG. 1 is a graph illustrating the etch rate of a tungsten wiring relative to the amount of sulfuric acid contained in a cleaning solution according to embodiments of the invention.

Hereinafter, the preferred embodiments of the invention will be described in detail with reference to the accompanying drawings. In the following drawings, like reference numerals identify similar or identical elements.

Cleaning Solution

A cleaning solution according to embodiments of the invention includes sulfuric acid ($H_2SO_4$), aqueous hydrogen peroxide solution ($H_2O_2$), deionized water ($H_2O$), and HF solution. The HF solution is prepared by diluting HF with deionized water. The cleaning solution efficiently removes various polymers remaining on a metal wiring formed on a substrate without damages of the metal wiring and an underlying film after a dry etch process is performed to form the metal wiring.

In particular, the cleaning solution has the following characteristics.

The cleaning solution can prevent damage to a tungsten wiring under an adequately controlled condition even though the sulfuric acid and the aqueous hydrogen peroxide solution contained in the cleaning solution may corrode the tungsten wiring.

The cleaning solution can completely remove various polymers including metallic components and oxygen-containing components generated during dry etching the tungsten wiring.

The cleaning solution can adequately etch oxygen-containing polymers while simultaneously preventing the lifting of the tungsten wiring due to en excessive etch of an underlying oxide film. In addition, the cleaning solution can prevent an increase in the aspect ratio of the tungsten wiring and the generation of a void in an interlayer dielectric film by reducing the etching of the interlayer dielectric film.

To meet the above-mentioned characteristics, cleaning solutions according to embodiments of the invention preferably include about 1 to about 10 percent by weight of sulfuric acid, about 0.5 to about 5 percent by weight of aqueous hydrogen peroxide solution, and about 85 to about 98.5 percent by weight of HF solution. Therefore, the cleaning solution can effectively remove the polymers generated during a formation of a structure including a tungsten wiring.

The cleaning solution preferably includes about 1 to about 10 percent by weight of sulfuric acid. If the cleaning solution includes less than about 1 percent by weight of sulfuric acid, the cleaning solution will not cause damage to a tungsten film pattern and an oxide film pattern formed on a substrate. However, the cleaning solution will not easily remove the polymers including metallic by-products and oxides generated during the etching of the tungsten film. When the cleaning solution includes more than about 10 percent by weight of sulfuric acid, although the cleaning solution can easily remove metallic polymers and oxygen-containing polymers generated during a formation of the tungsten film pattern, the cleaning solution may cause damage to the tungsten film pattern and the oxide film pattern. The cleaning solution preferably includes about 1 to about 10 percent by weight, and more preferably, about 3 to about 8 percent by weight of sulfuric acid.

Because sulfuric acid can easily corrode the tungsten film pattern, an etched amount of the tungsten film pattern can be controlled in accordance with the amount of the sulfuric acid contained in the cleaning solution. Additionally, the sulfuric acid serves as catalyst that augments the potential of hydrogen (pH) of the cleaning solution to more rapidly dissolve the hydrofluoric acid. Hence, the oxygen-containing polymers are more easily removed from the tungsten film pattern.

The cleaning solution preferably includes about 0.5 to about 5 percent by weight of aqueous hydrogen peroxide solution. When the cleaning solution includes less than about 0.5 percent of by weight of aqueous hydrogen peroxide solution, the metallic polymers and the oxygen-containing polymers are not easily removed although the cleaning solution will not cause damage to the tungsten film pattern and the oxide film pattern. In the case where the cleaning solution includes more than 5 percent by weight of aqueous hydrogen peroxide solution, the cleaning solution may cause the damages of the tungsten film pattern and the oxide film pattern although the cleaning solution will easily remove the metallic polymers and the oxygen-containing polymers. Therefore, the cleaning solution preferably includes about 0.5 to about 5, and more preferably about 1 to about 3 percent by weight of aqueous hydrogen peroxide solution. Here, the aqueous hydrogen peroxide solution has a concentration of about 25 to about 30 percent.

The amount of HF solution contained in the cleaning solution varies in accordance with the concentration of the hydrofluoric acid after dilution with deionized water. The HF solution includes about 1,000 ml of deionized water and about 0.1 to about 2 ml of hydrofluoric acid. In this case, the HF solution has a concentration of about 50 percent. The cleaning solution preferably includes about 85 to about 95 percent by weight of HF solution.

When the cleaning solution includes less than about 85 percent by weight of HF solution or the amount of hydrofluoric acid contained in the HF solution is less than 0.1 ml, the cleaning solution may not remove the oxygen-containing polymers.

When the cleaning solution includes more than 95 percent by weight of HF solution or the amount of hydrofluoric acid contained in the HF solution is more than 2 ml, the cleaning solution may cause damage to the tungsten film pattern and the oxide film pattern although the cleaning solution can easily remove the oxygen-containing polymers and the metallic polymers.

Thus, the cleaning solution preferably includes a HF solution of about 85 to about 95 percent by weight. Here, the hydrofluoric acid has a concentration of 50 percent and the HF solution includes about 0.1 to about 2 ml of hydrofluoric acid and about 1,000 ml of deionized water.

FIG. 1 is a graph illustrating an etch rate of a tungsten wiring relative to the amount of sulfuric acid contained in a cleaning solution according embodiments of the invention.

Referring to FIG. 1, the etch rate of the tungsten wiring increases from about 70 to about 330 Å/min as the amount of sulfuric acid contained in the cleaning solution is augmented from about 1 to about 10 percent by weight. Here, a substrate including the tungsten wiring was immersed in the cleaning solution having a temperature of about 25° C. for about 10 minutes.

When the amount of the sulfuric acid contained in the cleaning solution was more than about 5 percent by weight, the etch rate of the tungsten wiring rapidly increased. In order to easily control the etch rate of the tungsten wiring, the amount of the sulfuric acid contained in the cleaning solution is preferably no more than about 5 percent by weight.

Figure 2:
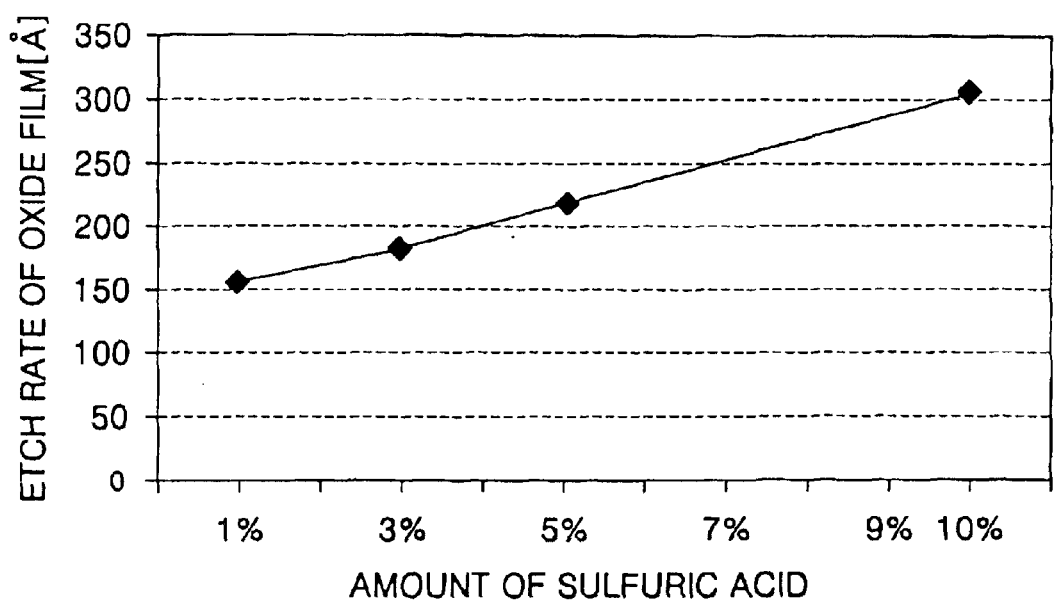
FIG. 2 is a graph illustrating the etch rate of an oxide film relative to the amount of sulfuric acid contained in a cleaning solution according to embodiments of the invention.

FIG. 2 is a graph illustrating an etch rate of an oxide film relative to the amount of sulfuric acid contained a cleaning solution according to embodiments of the invention.

Referring to FIG. 2, the etch rate of the oxide film increases from about 150 to about 300 Å/min as the amount of sulfuric acid contained in the cleaning solution increases from about 1 to about 10 percent by weight. In this case, a substrate including the oxide wiring was immersed in the cleaning solution having a temperature of about 25° C. for about 10 minutes.

Although the sulfuric acid cannot directly etch the oxide film, the sulfuric acid serves as a catalyst that can more rapidly dissociate hydrofluoric acid contained in the cleaning solution because the acidity of the cleaning solution increases in accordance with an increase of the amount of sulfuric acid contained in the cleaning solution. When the hydrofluoric acid is dissociated, it can more easily etch the oxide film and oxygen-containing polymers.

Figure 3:
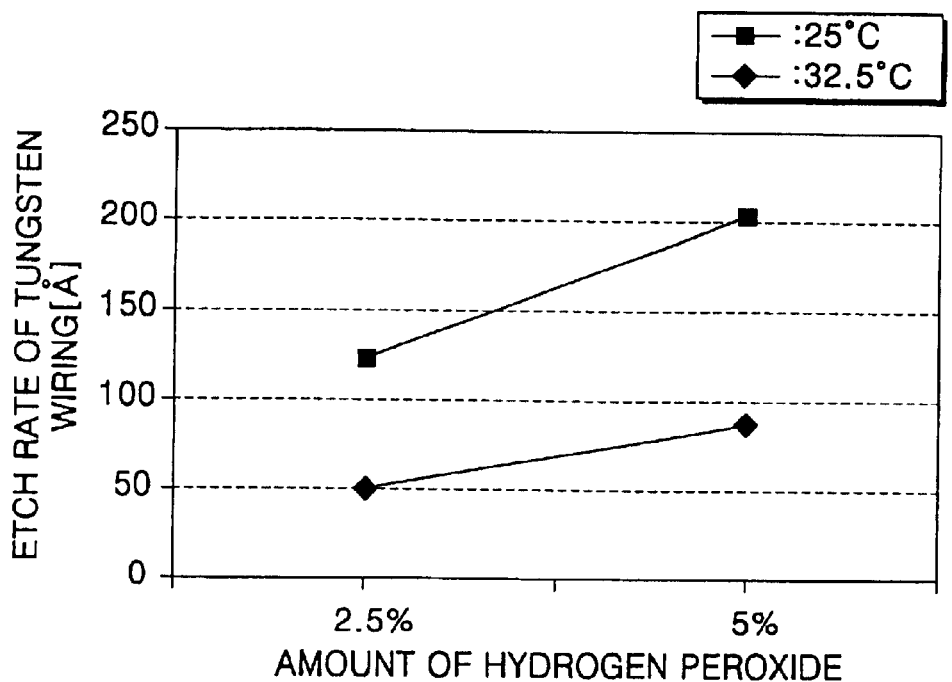
FIG. 3 is a graph illustrating the etch rate of a tungsten wiring relative to the amount of aqueous hydrogen peroxide solution contained in a cleaning solution according to embodiments of the invention.

FIG. 3 is a graph illustrating an etch rate of a tungsten wiring relative to the amount of aqueous hydrogen peroxide solution contained in a cleaning solution according to embodiments of the invention.

Referring to FIG. 3, the etch rate of the tungsten wiring increases from about 50 to about 90 Å/min as the amount of the aqueous hydrogen peroxide solution contained in the cleaning solution increases from about 2.5 to about 5 percent by weight at a temperature of about 25° C. Additionally, at a temperature of about 32.5° C., as the amount of the aqueous hydrogen peroxide solution contained in the cleaning solution increases from about 2.5 to about 5 percent by weight, the etch rate of the tungsten wiring increases from about 120 to about 200 Å/min. Here, the substrate including the tungsten wiring was immersed in the cleaning solution for about 10 minutes.

As described above, a temperature variation of the cleaning solution has a greater effect on the etch rate of the tungsten wiring than the amount of the aqueous hydrogen peroxide solution or the sulfuric acid. Accordingly, in order to more easily control the etch rate of the tungsten wiring, the temperature of the cleaning solution is preferably maintained at about 25° C. while the amounts of the aqueous hydrogen peroxide solution and the sulfuric acid are selectively adjusted.

Figure 4:
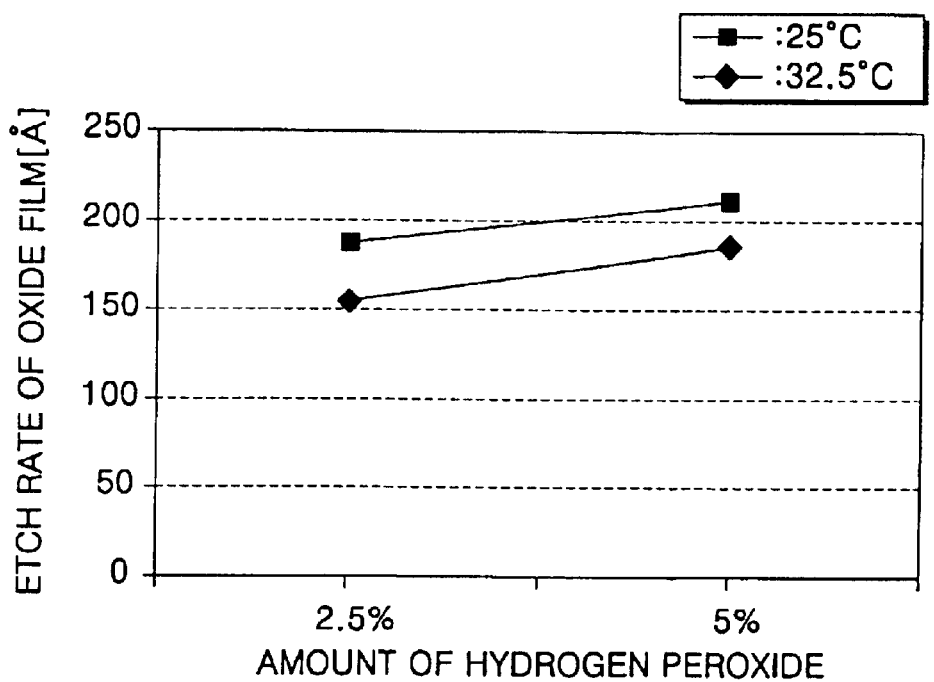
FIG. 4 is a graph illustrating the etch rate of an oxide film relative to the amount of aqueous hydrogen peroxide solution contained in a cleaning solution according to embodiments of the invention.

FIG. 4 is a graph illustrating an etch rate of an oxide film relative to the amount of aqueous hydrogen peroxide solution contained a cleaning solution according to embodiments of the invention.

Referring to FIG. 4, at a temperature of about 25° C., the etch rate of the oxide film increases from about 150 to about 170 Å/min as the amount of the aqueous hydrogen peroxide solution contained in the cleaning solution increases from about 2.5 to about 5 percent by weight. In addition, at a temperature of about 32.5° C., as the amount of the aqueous hydrogen peroxide solution contained in the cleaning solution increases from about 2.5 to about 5 percent by weight, the etch rate of the oxide film increases from about 180 to about 210 Å/min. In this case, a substrate including the oxide film was immersed in the cleaning solution for about 10 minutes.

When the amount of aqueous hydrogen peroxide solution contained in the cleaning solution increases, the etch rate of the oxide film gradually increases because the aqueous hydrogen peroxide solution does not directly etch the oxide film but serves as a catalyst for etching the oxide film.

Because the etch rate of the oxide film is more proportional to the temperature of the cleaning solution than the amount of the aqueous hydrogen peroxide solution contained in the cleaning solution, the temperature of the cleaning solution is maintained at about 25° C. while the amounts of sulfuric acid and aqueous hydrogen peroxide solution contained in the cleaning solution are selectively adjusted in order to easily control the etch rate of the oxide film.

According to embodiments of the invention, because the etch rates of the tungsten wiring and the oxide film vary greatly in accordance with the temperature of the cleaning solution and the amounts of the sulfuric acid and the aqueous hydrogen peroxide solution contained in the cleaning solution, the temperature of the cleaning solution and the amounts of etchant and catalyst are advantageously controlled to achieve pertinent etching of a metal wiring or an insulation film.

Method for Cleaning a Tungsten Wiring

In a process for cleaning polymers that remain on a tungsten wiring, a cleaning solution is provided in a cleaning bath. The cleaning solution includes about 5 percent by weight of sulfuric acid, about 2.5 percent by weight of aqueous hydrogen peroxide solution and about 92.5 percent by weight of HF solution. Here, the HF solution includes about 1,000 ml of deionized water and about 0.1 to about 2 ml of hydrofluoric acid. The hydrofluoric acid has a concentration of about 50 percent.

After a dry etch process is performed on a substrate that includes an oxide film and the tungsten wiring, the substrate is immersed in the cleaning solution. In this case, organic, metallic, and oxygen-containing polymers adhere to the tungsten wiring and the oxide film. The oxygen-containing polymers positioned on an outer sidewall of the tungsten wiring are first removed with the hydrofluoric acid contained in the cleaning solution. The tungsten wiring includes, for example, tungsten patterns.

When the oxygen-containing polymers are removed, the organic and metallic polymers are exposed. The organic and metallic polymers are removed by the aqueous hydrogen peroxide solution and sulfuric acid contained in the cleaning solution without damage to the tungsten wiring.

When a temperature of the cleaning solution is below about 20° C., the time required for completely removing the polymers from the sidewall of the tungsten wiring is greatly increased. To the contrary, when the cleaning solution has a temperature above about 30° C., damage to the tungsten wiring and an underlying layer may be caused even though the polymers may be rapidly removed from the tungsten wiring. Accordingly, the cleaning solution preferably has a temperature of about 25° C. to remove the polymers from the tungsten wiring.

Figure 5:
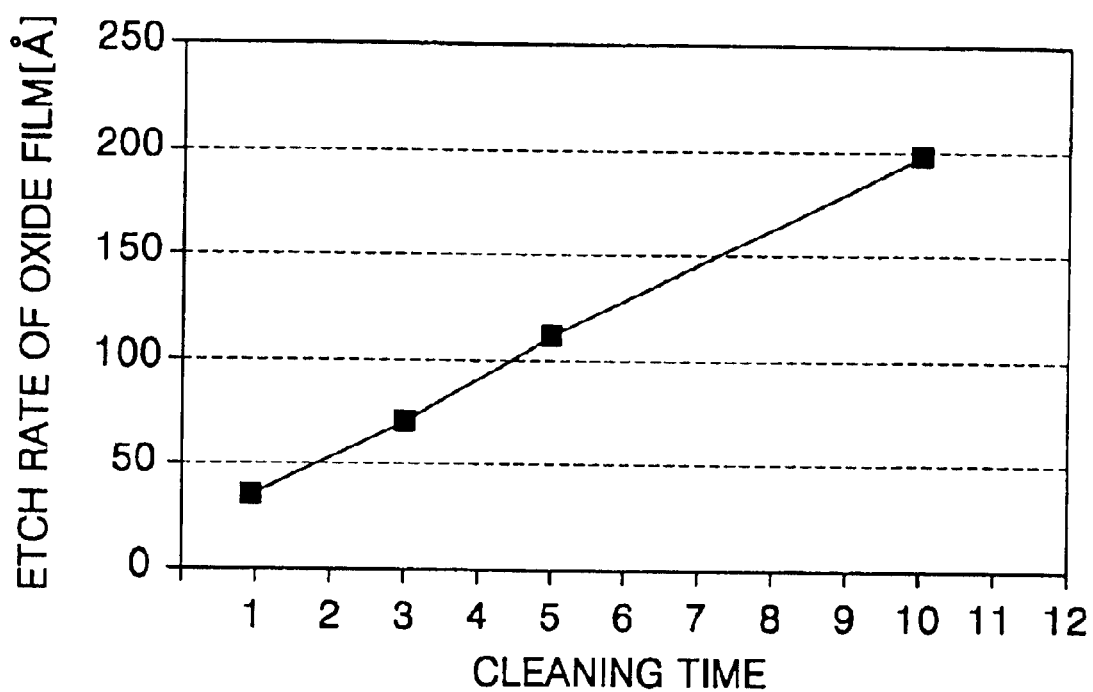
FIG. 5 is a graph illustrating the etch rate of an oxide film relative to the cleaning time using an embodiment of the invention.

FIG. 5 is a graph illustrating the etch rate of an oxide film relative to the cleaning time using a cleaning solution according to an embodiment of the invention. In FIG. 5, when the tungsten wiring including the polymers was cleaned, the etched amount of the oxide film formed beneath the tungsten wiring was observed by varying the cleaning time of the tungsten wiring so that the etch rate was measured in order to identify an advantageous cleaning time for the tungsten wiring.

Referring to FIG. 5, the polymers could be more completely removed from the tungsten wiring as the cleaning time increased, however, the underlying oxide film was excessively etched during removal of the polymers. That is, when the cleaning time increased from about 1 to about 10 minutes, the etch rate of the oxide film increased from about 30 to about 200 Å. Thus, a process for cleaning the tungsten wiring is preferably executed with a cleaning time of below about 9 minutes.

After the process for cleaning the tungsten wiring is accomplished, the substrate including the tungsten wiring is taken out of the cleaning solution. Then, the substrate is rinsed using deionized water to remove the cleaning solution remaining on the substrate. When the substrate is taken out of the cleaning solution, most polymers are dissolved in the cleaning solution or detached from the tungsten wiring so that most polymers are removed from the substrate or bond strengths between the polymers and the tungsten wiring are greatly reduced. Therefore, the polymers are cleaned from the substrate and the tungsten wiring when the rinsing process is performed on the substrate.

The substrate is dried to remove the remaining deionized water.

According to the method for cleaning the tungsten wiring, the polymers can be effectively removed from the tungsten wiring without damage to the tungsten wiring.

Figure 6A:
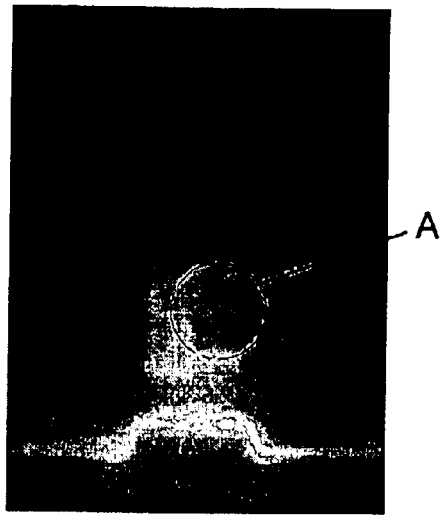
FIG. 6A is an electron microscope photograph illustrating a structure including a tungsten wiring cleaned using a conventional cleaning method.
Figure 6B:
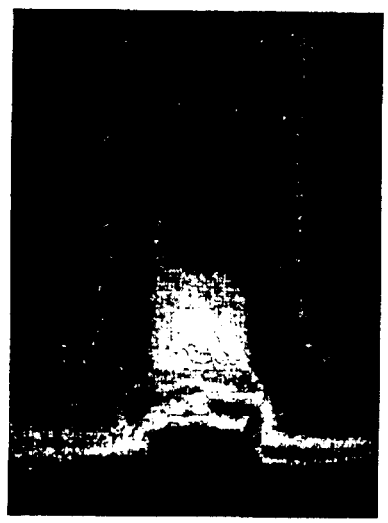
FIG. 6B is an electron microscope photograph illustrating a structure including a tungsten wiring cleaned in accordance with an embodiment of the invention.

FIG. 6A is an electron microscope photograph illustrating a structure including a tungsten wiring that was cleaned using a conventional cleaning method. FIG. 6B is an electron microscope photograph illustrating a structure including a tungsten wiring cleaned employing a cleaning method according to an embodiment of the invention.

Referring to FIG. 6A, oxygen-containing polymers are not sufficiently removed from the tungsten wiring and also damage of the tungsten wiring (region A) was caused when the tungsten wiring was cleaned using the conventional method. As shown in FIG. 6B, however, when the tungsten wiring is cleaned according to an embodiment of the invention, the polymers generated during etching of the tungsten wiring and during ashing of a photoresist pattern were completely removed from the tungsten wiring. Also, damage to the tungsten wiring and the underlying oxide film are not nearly as severe.

Hereinafter, a method of forming a structure of a semiconductor device will be described with reference to the accompanying drawings.

FIGS. 7A to 7D are cross-sectional diagrams illustrating a method of forming a transistor of a semiconductor device according to an embodiment of the invention.

Figure 7A:
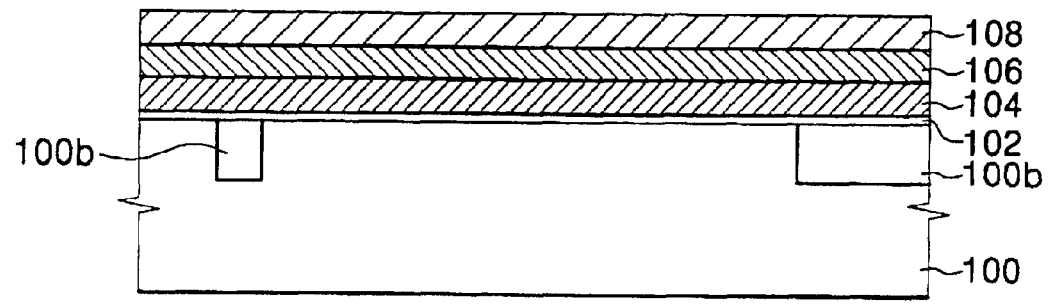
FIGS. 7A to 7D are cross-sectional diagrams illustrating a method of forming a transistor of a semiconductor device according to an embodiment of the invention.

Referring to FIG. 7A, an isolation process such as a shallow trench isolation (STI) process or a local oxidation of silicon (LOCOS) is performed on a substrate 100 to define an active region and a field region 100b. Preferably, the active and field regions 100b are defined using the STI process.

Particularly, the substrate 100 is partially etched to form a trench at a portion of the substrate 100 corresponding to the field region 100b. After a silicon oxide film is formed on the substrate 100 and fills up the trench, the silicon oxide film is etched using a chemical mechanical polishing (CMP) process, thereby forming a filed oxide film in the trench to define the field region 100b.

Figure 7B:
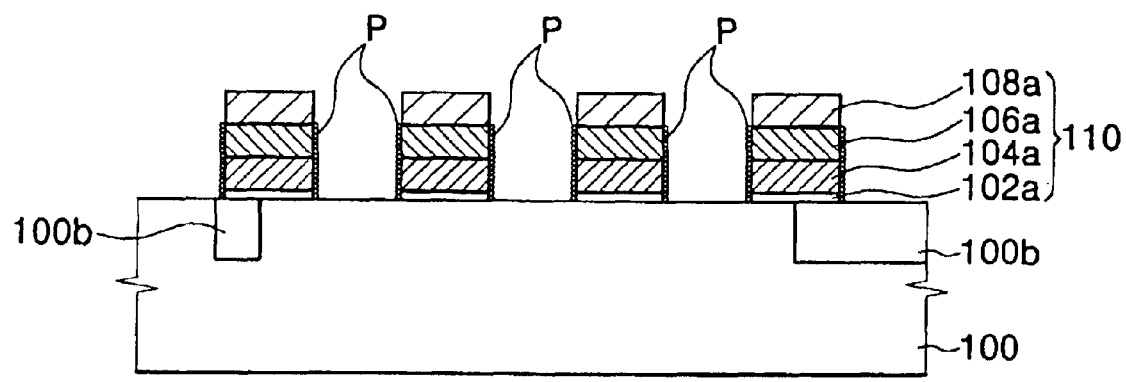

Referring to FIG. 7B, after impurities are selectively implanted into portions of the substrate 100 to from a P-type well and an N-type well on the substrate 100, gate electrodes 110 are formed on the substrate 100. The gate electrodes 110 include gate oxide film patterns 102a, first polysilicon film pattern 104a, first tungsten film patterns 106a, and first nitride film patterns 108a, respectively.

Particularly, a gate oxide film 102 having a thickness of about 50 to about 100 Å is formed on the substrate 100. A first polysilicon film 104 doped with N-type impurities is formed on the gate oxide film 102 to a thickness of about 1,000 to about 1,500 Å. A first tungsten film 106 is formed on the first polysilicon film 104 in order to reduce a resistance of the gate electrode 110. Alternatively, a first tungsten silicide film can be formed on the first polysilicon film 104 instead of the first tungsten film 106. A first nitride film 108 is formed on the tungsten film 106. Alternatively, a barrier layer can be formed between the first polysilicon film 104 and the first tungsten film 106 so as to easily form the first tungsten film 106. After a photoresist pattern (not shown) is formed on the first nitride film 108 to define a layout of the gate electrodes 110, the first nitride film 108, the first tungsten film 106, the first polysilicon film 104, and the gate oxide film 102 are successively etched using the photoresist film as an etching mask, thereby forming the gate oxide film patterns 102a, the first polysilicon film patterns 104a, the first tungsten film patterns 106a, and the first nitride film patterns 108a. As a result, the gate electrodes 110 serve as word lines for a semiconductor device that is formed on the substrate 100. The photoresist pattern is removed via a plasma ashing process and a stripping process using sulfuric acid.

When the gate electrodes 110 are formed using the etching process, a great quantity of polymers (P) is attached to sidewalls of the gate electrodes 110. The polymers (P) are generated during the etching of the photoresist pattern, the first nitride film 108, the first tungsten film 106, the first polysilicon film 104, and the gate oxide film 102. The polymers (P) may increase the electrical resistance of the transistor including the first tungsten film patterns 106a so they should be removed from the gate electrodes 110.

Figure 7C:
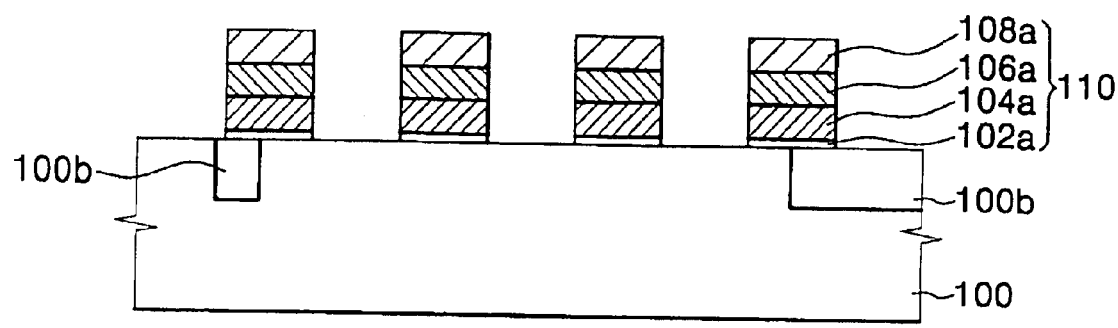

Referring to FIG. 7C, in order to remove the polymers (P) attached to the sidewalls of the gate electrodes 110 including the first tungsten film patterns 106a, a cleaning bath including a cleaning solution is provided. The cleaning solution includes about 5 to about 7 percent by weight of sulfuric acid, about 2.5 percent by weight of aqueous hydrogen peroxide solution and about 90.5 to about 92.5 percent by weight of HF solution. In this case, the HF solution includes about 0.1 to about 2 ml of hydrofluoric acid and about 1,000 ml of deionized water wherein the hydrofluoric acid has a concentration of about 50 percent.

The substrate 100 including the polymers (P) attached thereto is immersed in the cleaning solution having a temperature of about 20 to about 30° C. for about 1 to about 9 minutes so that the polymers (P) are removed from the gate electrodes 110.

In particular, the polymers (P) include organic polymers, metallic polymers, and oxygen-containing polymers. The organic and metallic polymers are first attached on the sidewalls of the gate electrodes 110 when the tungsten film patterns 106a are formed. The oxygen-containing polymers are attached to the metallic polymers and the sidewalls of the first tungsten film patterns 106a when the gate film patterns 102a are formed.

To remove these polymers (P), the substrate 100 including the gate electrodes 110 is immersed in the cleaning solution bath. The oxygen-containing polymers are first removed from the sidewalls of the gate electrodes 110 using the hydrofluoric acid included in the cleaning solution.

When the oxygen-containing polymers are removed, the organic polymers and the metallic polymers are exposed. The organic and metallic polymers are removed from the gate electrodes 110 using the aqueous hydrogen peroxide solution and the sulfuric acid contained in the cleaning solution without damage to the first tungsten film patterns 106a.

In cases where the cleaning solution has a temperature of below about 20° C., the time required for removing the polymers (P) attached to the gate electrodes 110 is greatly increased. On the other hand, when the cleaning solution has a temperature of above about 30° C., the gate electrodes 110 and the gate oxide film patterns may be damaged although the polymers (P) are rapidly removed from the gate electrodes 110. Therefore, the cleaning solution advantageously has a temperature of about 25° C.

After the substrate 100 including the gate electrodes 110 is taken out of the cleaning solution, the substrate 100 is rinsed using deionized water to remove the remaining cleaning solution. When the substrate 100 is taken out of the cleaning solution, most polymers (P) are dissolved by components contained in the cleaning solution and removed from the gate electrodes 110, the polymers (P) are detached from the gate electrodes 110, or the adhesion strength between the gate electrodes 110 and the polymers (P) is greatly reduced. Hence, the polymers (P) remaining on the substrate 100 are completely removed during the rinsing process using deionized water.

Then, a dry process is performed on the rinsed substrate 100 to remove the deionized water remaining on the substrate 100. In this case, various polymers can be completely removed from the gate electrodes without the damages of the gate oxide film patterns 102 and the first tungsten film patterns 106a.

Figure 7D:
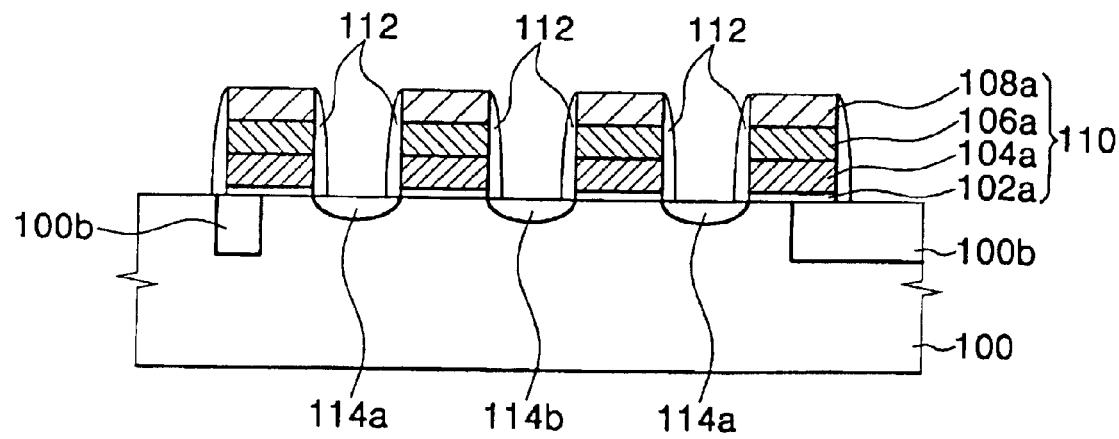

Referring to FIG. 7D, nitride spacers 112 are formed on the sidewalls of the gate electrodes 110. Impurities are implanted into portions of the substrate 100 between the gate electrodes 110 using the gate electrodes 110 as masks, thereby forming source/drain regions 114a and 114b between the gate electrodes 110. Thus, transistor structures including the gate electrodes 110, the spacers 112, and the source/drain regions 114a and 114b are formed on the substrate 100.

In this embodiment, the source regions 114a of the transistor structures correspond to contact regions of capacitors and the drain regions 114b of the transistor structures correspond to contact regions of bit lines.

FIGS. 8A to 8E are cross-sectional diagrams illustrating a method of forming a bit line of a semiconductor device according to another embodiment of the invention. In this embodiment, the processes for forming transistor structures are identical to those of the embodiment described in FIGS. 7A–7D.

Figure 8A:
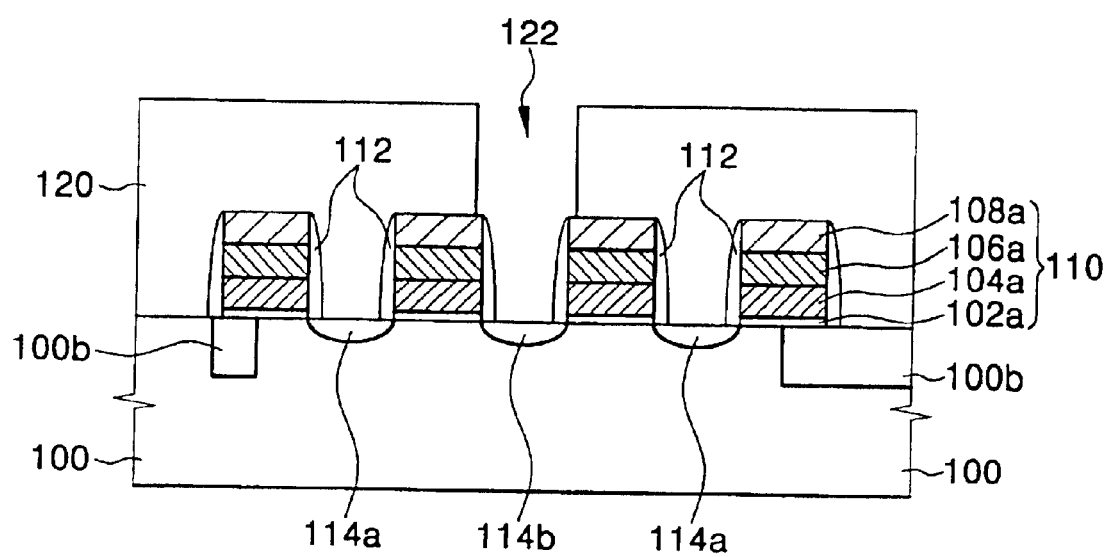
FIGS. 8A to 8E are cross-sectional diagrams illustrating a method of forming a bit line of a semiconductor device according to another embodiment of the invention.

Referring to FIG. 8A, a first oxide film is formed on the substrate 100 where the transistor structures are formed. The first oxide film is etched using an etch back process or a CMP process until upper faces of the transistor structures are exposed. Thus, a first interlayer dielectric film 120 is formed on the substrate 100 to cover the transistor structures. The first interlayer dielectric film 120 includes boro-phosphor silicate glass (BPSG), undoped silicate glass (USG), or silicon oxide.

After a mask pattern (not shown) is formed on the first interlayer dielectric film 120, a portion of the first interlayer dielectric film 120 is anisotropically etched to form a contact hole 122 using the mask pattern as an etching mask. The contact hole 122 exposes the drain region 114a of the transistor structure. The contact hole 122 is formed as a self-aligned contact by the spacer 120 in order to ensure a process margin.

Figure 8B:
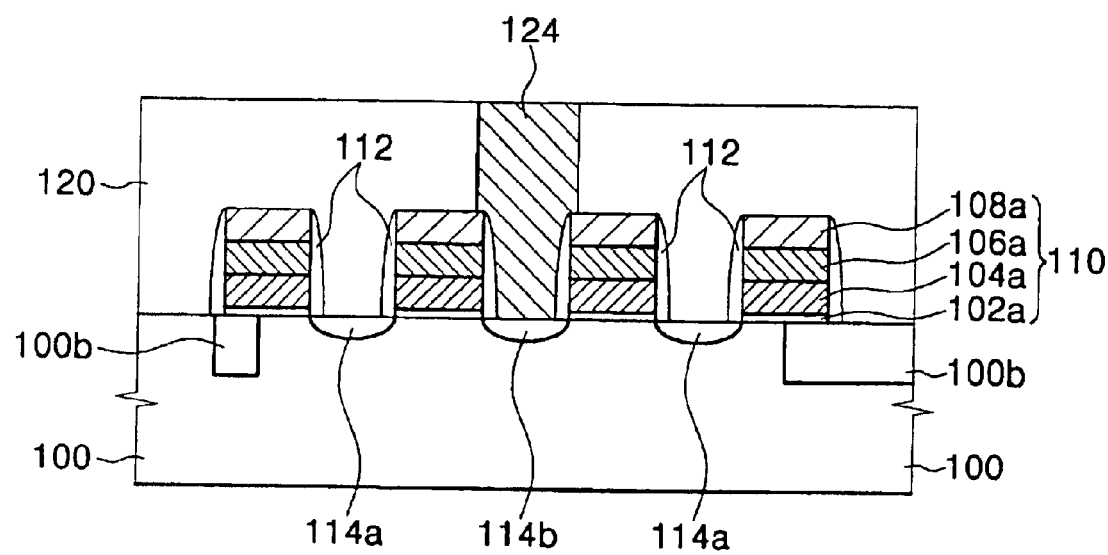

Referring to FIG. 8B, a conductive material like tungsten is formed on the first interlayer dielectric film 120 to fill up the contact hole 122, and a portion of the conductive material on the first interlayer dielectrics is etched using a CMP process. Hence, a conductive plug 124 is formed in the contact hole 122. The conductive plug 124 is electrically connected to the drain region 114b of the transistor structure.

Figure 8C:
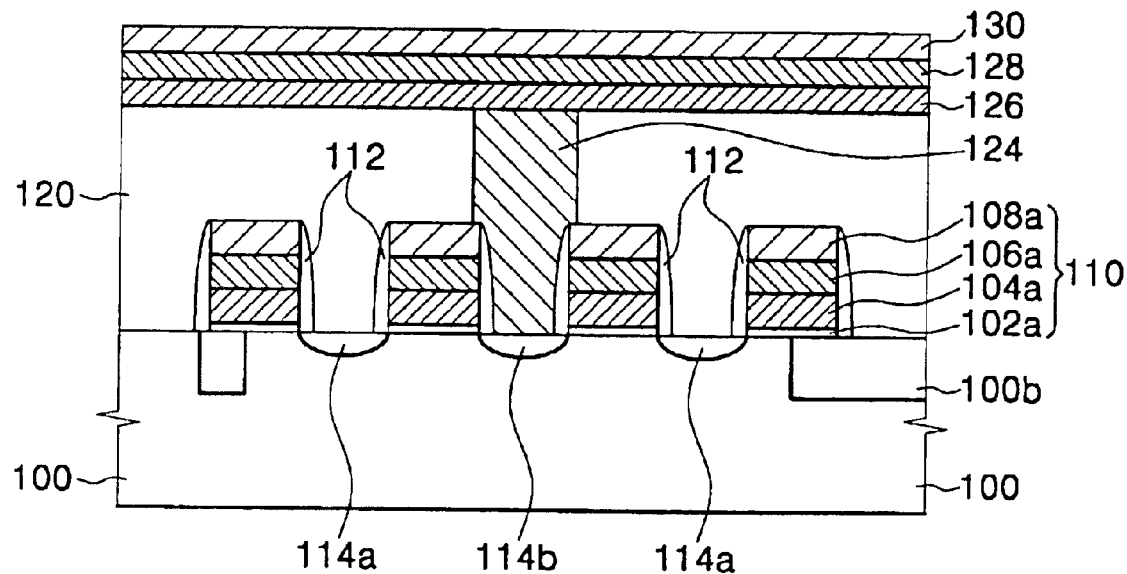

Referring to FIG. 8C, a bit line 132 is formed on the first interlayer dielectric film 120 where the conductive plug 124 is formed. In a process of forming the bit line 132, a second polysilicon film 126, a second tungsten film 128, and a second nitride film 130 are successively formed on the first interlayer dielectric film 120 in which the conductive plug 124 is formed. Alternatively, a second tungsten silicide film can be formed on the second polysilicon film 126 instead of the second tungsten film 128. In addition, a barrier layer can be formed between the second polysilicon film 126 and the second tungsten film 128 so as to easily form the second tungsten film 128 on the second polysilicon film 126.

Figure 8D:
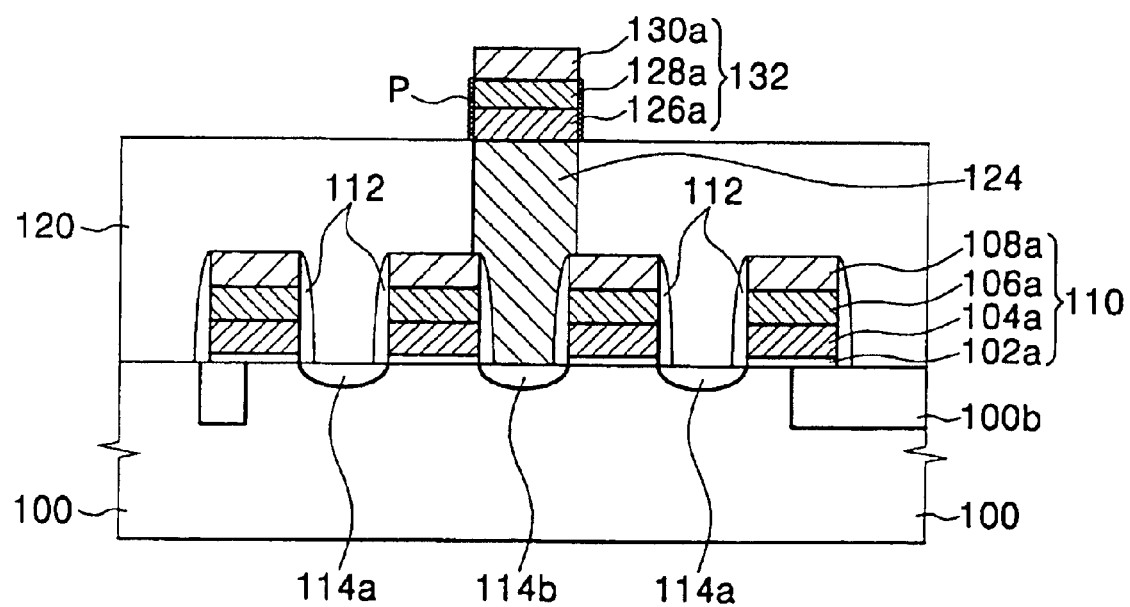

Referring to FIG. 8D, the second nitride film 130, the second tungsten film 128, and the second polysilicon film 126 are successively etched using a mask pattern (not shown) and a dry etch process to form the bit line 132 including a second nitride film pattern 130a, a second tungsten film pattern 128a, and the second polysilicon film pattern 126a. The bit line 132 is positioned on the conductive plug 124. When the dry etch process is accomplished, a large quantity of polymers (P) adhere to a sidewall of the bit line 132. The polymers (P) are generated during etching of the second nitride film 130, the second tungsten film 128, the second polysilicon film 126, and the mask pattern. The polymers (P) may increase the electrical resistance of the bit line 132 including the second tungsten film pattern 128a. Therefore, the polymers (P) should be completely removed from the sidewall of the bit line 132.

Figure 8E:
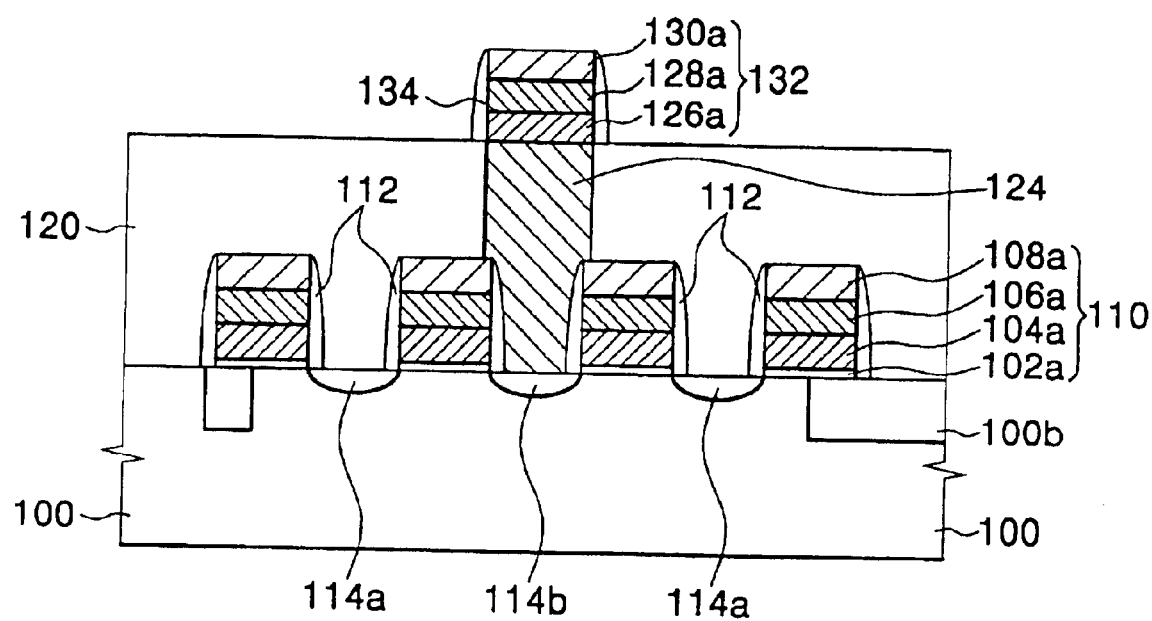

Referring to FIG. 8E, in order to remove the polymers (P) attached to the sidewall of the bit line 132 having the second tungsten film pattern 128a, a bath receiving cleaning solution is prepared. The cleaning solution includes about 5 percent by weight of sulfuric acid, about 2.5 percent by weight of aqueous hydrogen peroxide solution, and about 92.5 percent by weight of HF solution. In this case, the HF solution has about 1,000 ml of deionized water and about 0.1 to about 2 ml of hydrofluoric acid. The hydrofluoric acid has a concentration of about 50 percent.

The substrate 100 having the resultant structure to which the polymers (P) are attached is immersed in the cleaning solution, which has a temperature of about 20 to about 30° C., for about 1 to about 9 minutes. Thus, the polymers (P) are removed from the bit line 132. Here, a process for removing the polymers (P) is performed under conditions identical to those of the embodiment described in FIGS. 7A–7D.

After the substrate 100 is taken out of the cleaning solution, the substrate 100 is rinsed using deionized water to remove the cleaning solution remaining on the substrate 100.

The substrate 100 is the dried to remove the remaining deionized water on the substrate. Consequently, the polymers (P) are completely removed from the sidewall of the bit line 132 without damage to the first interlayer dielectric film 120 or the second tungsten film pattern 128a.

A silicon nitride film having a uniform thickness is continuously formed on the first interlayer dielectric film 120 and on the bit line 132, and then the silicon nitride film is etched using an etch back process to form a spacer 134 on the sidewall of the bit line. Thus, a bit line structure including the bit line 132 and the spacer 134 is completed. In this embodiment, a semiconductor device including the bit line structure can have improved electrical characteristics because the bit line structure can has a second tungsten film pattern 128a that is damage-free.

According to embodiments of the invention, various polymers attached to metal patterns can be easily removed without damage to the metal patterns or the underlying oxide film. In addition, a throughput of a semiconductor device can be improved by reducing the time required for removing the polymers.

Embodiments of the invention will now be described in a non-limiting way.

Embodiments of the invention provide a cleaning solution for removing a polymer that includes about 1 to about 10 percent by weight of sulfuric acid, about 0.5 to about 5 percent by weight of aqueous hydrogen peroxide solution, and about 85 to about 98.5 percent by weight of HF solution. The HF solution includes about 1,000 ml of deionized water and about 0.1 to about 2 ml of hydrofluoric acid, wherein the hydrofluoric acid has a concentration of about 45 about 55 percent, and preferably about 50 percent.

Embodiments of the invention also provide a method of cleaning a semiconductor device. After a cleaning solution is prepared, polymers attached to a metal wiring formed on a substrate are removed. The cleaning solution includes about 1 to about 10 percent by weight of sulfuric acid, about 0.5 to about 5 percent by weight of aqueous hydrogen peroxide solution and about 85 to about 98.5 percent by weight of HF solution. The polymers are removed by immersing (or dipping) the substrate into the cleaning solution after a dry etching process is performed to form the metal wiring on the substrate. Then, the substrate is rinsed to remove the remaining, cleaning solution and the substrate is dried. In this case, the cleaning solution has a temperature of about 20 to about 30° C. and the substrate is immersed in the cleaning solution for about 1 to about 9 minutes.

In accordance with another embodiment of the invention, there is provides a method of forming a structure of a semiconductor device. A substrate is provided. The substrate includes a polysilicon film, a tungsten film, and a nitride film successively formed thereon. Subsequently, a mask pattern is formed on the nitride film and structure is formed on the substrate. The structure includes a nitride film pattern, a tungsten film pattern, and a polysilicon film pattern formed by dry etching the polysilicon film, the tungsten film, and the nitride film. After the mask pattern is removed, polymers attached to a sidewall of the structure formed on the substrate are removed. The polymers are removed by immersing the substrate into the cleaning solution including about 1 to about 10 percent by weight of sulfuric acid, about 0.5 to about 5 percent by weight of aqueous hydrogen peroxide solution, and about 85 to about 98.5 percent by weight of HF solution. In this case, the hydrogen fluoric acid solution HF solution includes about 1,000 ml of deionized water and about 0.1 to about 2 ml of hydrofluoric acid, wherein the hydrofluoric acid has a concentration of about 45 to about 55 percent, and preferably about 50 percent. Then, the substrate is rinsed to remove the cleaning solution and dried. Alternatively, a barrier layer is formed between the polysilicon film and the tungsten film.

Having described several exemplary embodiments of the invention, it is noted that modifications and variations can be made by persons skilled in the art in light of the above teachings. It is therefore to be understood that changes may be made to the particular embodiments of the invention disclosed that are nevertheless within the scope and the spirit of the invention as outlined by the appended claims.

What is claimed is:

1. A method of cleaning a semiconductor device comprising:

removing polymers attached to a metal wiring formed on a substrate by immersing the substrate in a cleaning solution including about 1 to about 10 percent by weight of sulfuric acid, about 0.5 to about 5 percent by weight of an aqueous hydrogen peroxide solution, and about 0.01% to about 0.11% of hydrofluoric acid;

rinsing the substrate to remove the remaining cleaning solution; and drying the substrate.

2. The method of claim 1, wherein removing polymers further comprises raising a temperature of the cleaning solution to a temperature of about 20 to about 30° C.

3. The method of claim 2, wherein immersing the substrate in the cleaning solution comprises immersing the substrate in the cleaning solution for about 1 to about 9 minutes.

4. The method of claim 1, wherein the metal wiring corresponds to a gate electrode that includes tungsten or a bit line that includes tungsten.

5. The method of claim 1, wherein the polymers comprise one selected from the group consisting of organic polymers, metallic polymers, and oxygen-containing polymers.

6. A method of cleaning a semiconductor device, comprising:

removing polymers attached to a metal wiring formed on a substrate by immersing the substrate in a cleaning solution, said cleaning solution including:
about 1 to about 10 percent by weight of sulfuric acid,
about 0.5 to about 5 percent by weight of an aqueous hydrogen peroxide solution, and
about 100 ppm to about 1080 ppm hydrofluoric acid;

rinsing the substrate to remove the cleaning solution; and drying the substrate.

7. The method of claim 6 wherein immersing the substrate in the cleaning solution comprises raising a temperature of the cleaning solution to a temperature of about 20 to about 30° C.

8. The method of claim 6 wherein immersing the substrate in the cleaning solution comprises immersing the substrate in the cleaning solution for about 1 to about 9 minutes.

9. The method of claim 6 wherein the metal wiring corresponds to a gate electrode that includes tungsten or a bit line that includes tungsten.

10. The method of claim 6 wherein the polymers are selected from the group consisting of organic polymers, metallic polymers, and oxygen-containing polymers.

11. A method of forming a structure for a semiconductor device, comprising:

dry etching a polysilicon film, a tungsten film, and a nitride film that are successively disposed on a substrate using a mask pattern formed on the nitride film;

removing the mask pattern;

removing polymers attached to a sidewall of the structure by immersing the substrate in a cleaning solution, wherein the cleaning solution comprises about 1 to about 10 percent by weight of sulfuric acid, about 0.5 to about 5 percent by weight of aqueous hydrogen peroxide solution, and about 100 ppm to about 1100 ppm of hydrofluoric acid;

rinsing the substrate to remove cleaning solution remaining on the substrate; and drying the substrate.

12. The method of claim 11, further comprising depositing a barrier layer between the polysilicon film and the tungsten film.

13. The method of claim 11 wherein the structure includes a gate electrode or a bit line.

14. The method of claim 11 wherein immersing the substrate in a cleaning solution comprises immersing the substrate in a cleaning solution with a temperature of about 20 to about 30° C.

15. The method of claim 14 wherein immersing the substrate in a cleaning solution further comprises immersing the substrate in a cleaning solution for about 1 to about 9 minutes.

* * * * *

UNITED STATES PATENT AND TRADEMARK OFFICE
CERTIFICATE OF CORRECTION

PATENT NO. : 6,875,706 B2  Page 1 of 1
DATED : April 5, 2005
INVENTOR(S) : Lee et al.

It is certified that error appears in the above-identified patent and that said Letters Patent is hereby corrected as shown below:

Column 2,
Line 6, replace "suicide" with -- silicide --.
Line 41, replace "the provide" with -- provide --.
Line 42, replace "tungston" with -- tungsten --.

Column 9,
Line 3, replace "hydrofluoric" with -- hydrogen fluoric --.

Column 11,
Line 24, replace "45 about 55" with -- 45 to about 55 --.
Line 37, replace "remaining, cleaning" with -- remaining cleaning --.

Signed and Sealed this

Twenty-fifth Day of April, 2006

JON W. DUDAS
*Director of the United States Patent and Trademark Office*